(12) United States Patent
Chen et al.

(10) Patent No.: US 8,049,496 B2
(45) Date of Patent: Nov. 1, 2011

(54) WIDEBAND MAGNETIC RESONANCE IMAGING APPARATUS AND METHOD

(75) Inventors: Jyh-Horng Chen, Taipei (TW); Tzi-Dar Chiueh, Taipei (TW); Edzer L. Wu, Taipei (TW); Li-Wei Kuo, Taipei (TW)

(73) Assignee: National Taiwan University, Da-An District, Taipei (TW)

( * ) Notice: Subject to any disclaimer, the term of this patent is extended or adjusted under 35 U.S.C. 154(b) by 282 days.

(21) Appl. No.: 12/370,214

(22) Filed: Feb. 12, 2009

(65) Prior Publication Data

US 2010/0148773 A1    Jun. 17, 2010

Related U.S. Application Data

(63) Continuation-in-part of application No. 12/337,388, filed on Dec. 17, 2008.

(51) Int. Cl.
 *G01V 3/00* (2006.01)
(52) U.S. Cl. .................................. 324/307; 324/309
(58) Field of Classification Search .................. 324/307, 324/309
 See application file for complete search history.

(56) References Cited

U.S. PATENT DOCUMENTS

| | | | | |
|---|---|---|---|---|
| 4,742,304 A | * | 5/1988 | Schnall et al. | 324/318 |
| 4,792,759 A | * | 12/1988 | Keren et al. | 324/322 |
| 4,983,920 A | * | 1/1991 | Lampman et al. | 324/309 |
| 5,041,790 A | * | 8/1991 | Tropp et al. | 324/318 |
| 5,064,638 A | * | 11/1991 | Moore et al. | 324/310 |
| 5,422,572 A | * | 6/1995 | Yao | 324/309 |
| 5,446,384 A | * | 8/1995 | Dumoulin | 324/307 |

OTHER PUBLICATIONS

Paley, Martyn N.J., et al., "Simultaneous Parallel Inclined Readout Image Technique", Magnetic Resonance Imaging 24 (2006)557-562, Sep. 16, 2005.
Weaver, John B., "Simultaneous Multislice Acquisition of MR Images", Simulatneous Multislice Acquisition of MR Images, Jan. 19, 1988.

* cited by examiner

*Primary Examiner* — Louis Arana
(74) *Attorney, Agent, or Firm* — Thomas, Kayden, Horstemeyer & Risley, LLP

(57) ABSTRACT

A magnetic resonance imaging (MRI) method is provided, including the steps of generating a wideband RF signal that has a plurality of frequency bands respectively corresponding to a plurality of different kinds of nuclei, to simultaneously excite the different kinds of nuclei, detecting a wideband responsive RF signal that has a plurality of frequency bands respectively emitted by the different kinds of nuclei, and reconstructing magnetic resonance images for the different kinds of nuclei based on the wideband responsive RF signal. An MRI apparatus employing the MRI method is also provided.

35 Claims, 13 Drawing Sheets

| Nucleus | Gyromagnetic Ratio (MHz/T) |
|---|---|
| $^1$H | 42.58 |
| $^2$H | 6.54 |
| $^3$He | 32.44 |
| $^{13}$C | 10.71 |
| $^{14}$N | 3.08 |
| $^{17}$O | 5.77 |
| $^{19}$F | 40.08 |
| $^{23}$Na | 11.27 |
| $^{31}$P | 17.25 |
| $^{129}$Xe | 11.86 |

FIG.1

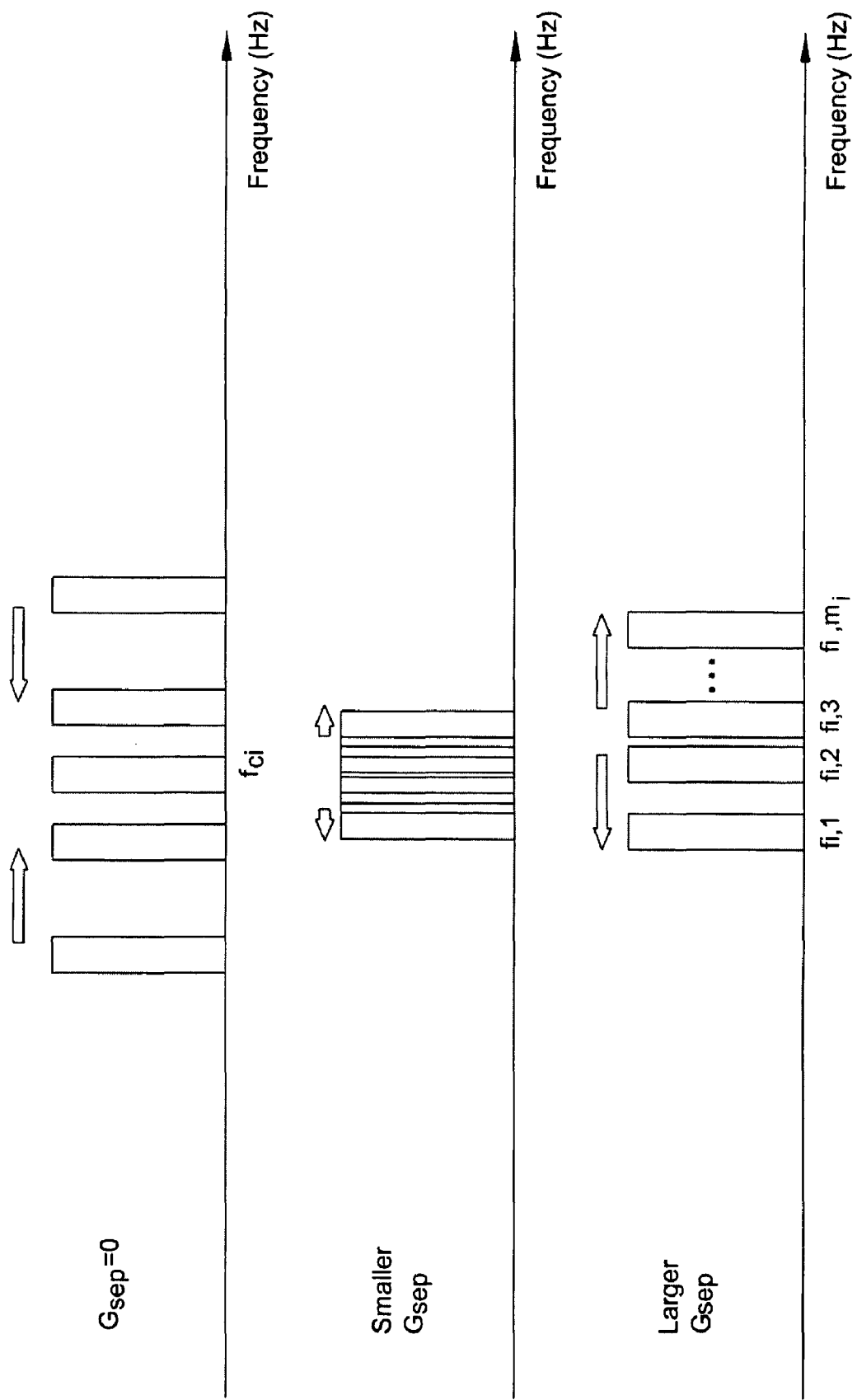

WIDEBAND MAGNETIC RESONANCE IMAGING APPARATUS AND METHOD

CROSS-REFERENCES TO RELATED APPLICATION

The present application is a continuation in part of the U.S. patent application Ser. No. 12/337,388, filed on Dec. 17, 2008, entitled "Method and Apparatus for Simultaneously Acquiring Multiple Slices/Slabs in Magnetic Resonance System," which is incorporated herein by reference in its entirety as if set forth in full.

BACKGROUND

1. Technical Field

The embodiments described herein relate to a magnetic resonance imaging (MRI) apparatus and an MRI method, and more particularly, to a wideband MRI apparatus and a wideband MRI method capable of simultaneously acquiring magnetic resonance (MR) images for different kinds of nuclei.

2. Related Art

An MRI apparatus is configured to reconstruct MR images based on MR signals. A MRI apparatus typically applies a static magnetic field, a gradient magnetic field, and a radio frequency (RF) signal having a selected frequency to a subject to excite a selected nucleus type and then detect the MR signal responsively emitted by the excited nucleus. The selected frequency of the RF signal has to be tuned to be equal or close to the resonance frequency of the selected nucleus type, or the so-called Larmor frequency, which depends on the gyromagnetic ratio of the selected nucleus type and the intensity of the total magnetic field. Different kinds of nuclei have different gyromagnetic ratios and therefore have different resonance frequencies.

FIG. 1 is a table summarizing the gyromagnetic ratios for some exemplary kinds of nuclei. As shown, the gyromagnetic ratios may vary greatly between different kinds of nuclei. Accordingly, the frequency ranges to excite and detect different kinds of nuclei may differ greatly, for example, from several MHzs to several tens of MHzs.

Different kinds of nuclei reveal different information on a subject, for example, which can be related to different physiological activities or maladies. Moreover, correlative studies on MR images of different kinds of nuclei are often required to achieve more profound observation on a subject and hence more accurate disease prediction, tracking, or diagnosis, for example.

In order to acquire different information revealed by different kinds of nuclei that have significantly different excitation/detection frequency ranges, a conventional MRI apparatus employs a frequency switching strategy: it switches between different RF excitation/detection frequencies, sequentially performing imaging operations multiple times, and in each imaging operation, merely exciting and detecting a single kind of nucleus. As a result, the total imaging time is considerably lengthy.

Furthermore, the response time of the MR signals may also differ greatly among different kinds of nuclei, making the sequential MR imaging operations during a lengthy imaging course incapable of timely capturing MR images, particularly for the nuclei with very short response time. Accordingly, different MR images acquired at different times by a conventional MRI apparatus cannot faithfully demonstrate real characteristics, e.g., physiological activities, within a subject.

SUMMARY

A wideband MRI apparatus and a wideband MRI method capable of saving total imaging time and providing more accurate information by simultaneously acquiring MR images for different kinds of nuclei are described herein.

In one aspect, an MRI method is provided. The MRI method comprises generating a wideband RF signal that has a plurality of frequency bands respectively corresponding to a plurality of different kinds of nuclei, to simultaneously excite the different kinds of nuclei, detecting a wideband responsive RF signal that has a plurality of frequency bands respectively emitted by the different kinds of nuclei, and reconstructing magnetic resonance images for the different kinds of nuclei based on the wideband responsive RF signal.

In one aspect, an MRI apparatus employing the MRI method is also provided. The MRI apparatus comprises an RF system configured to generate a wideband RF signal that has a plurality of frequency bands respectively corresponding to a plurality of different kinds of nuclei, to simultaneously excite the different kinds of nuclei, and further to detect a wideband responsive RF signal that has a plurality of frequency bands respectively emitted by the different kinds of nuclei, and an imaging processing module configured to reconstruct magnetic resonance images for the different kinds of nuclei based on the wideband responsive RF signal.

These and other features, aspects, and embodiments are described below in the section entitled "Detailed Description."

BRIEF DESCRIPTION OF THE DRAWINGS

Features, aspects, and embodiments are described in conjunction with the attached drawings, in which:

FIG. 1 is a table summarizing the gyromagnetic ratios for some exemplary kinds of nuclei;

FIG. 8 is an exemplary diagram schematically illustrating the separation of neighboring frequency components of the FID signal under different intensities of the slice/slab separation gradient in accordance with one embodiment;

DETAILED DESCRIPTION

Figure 2:
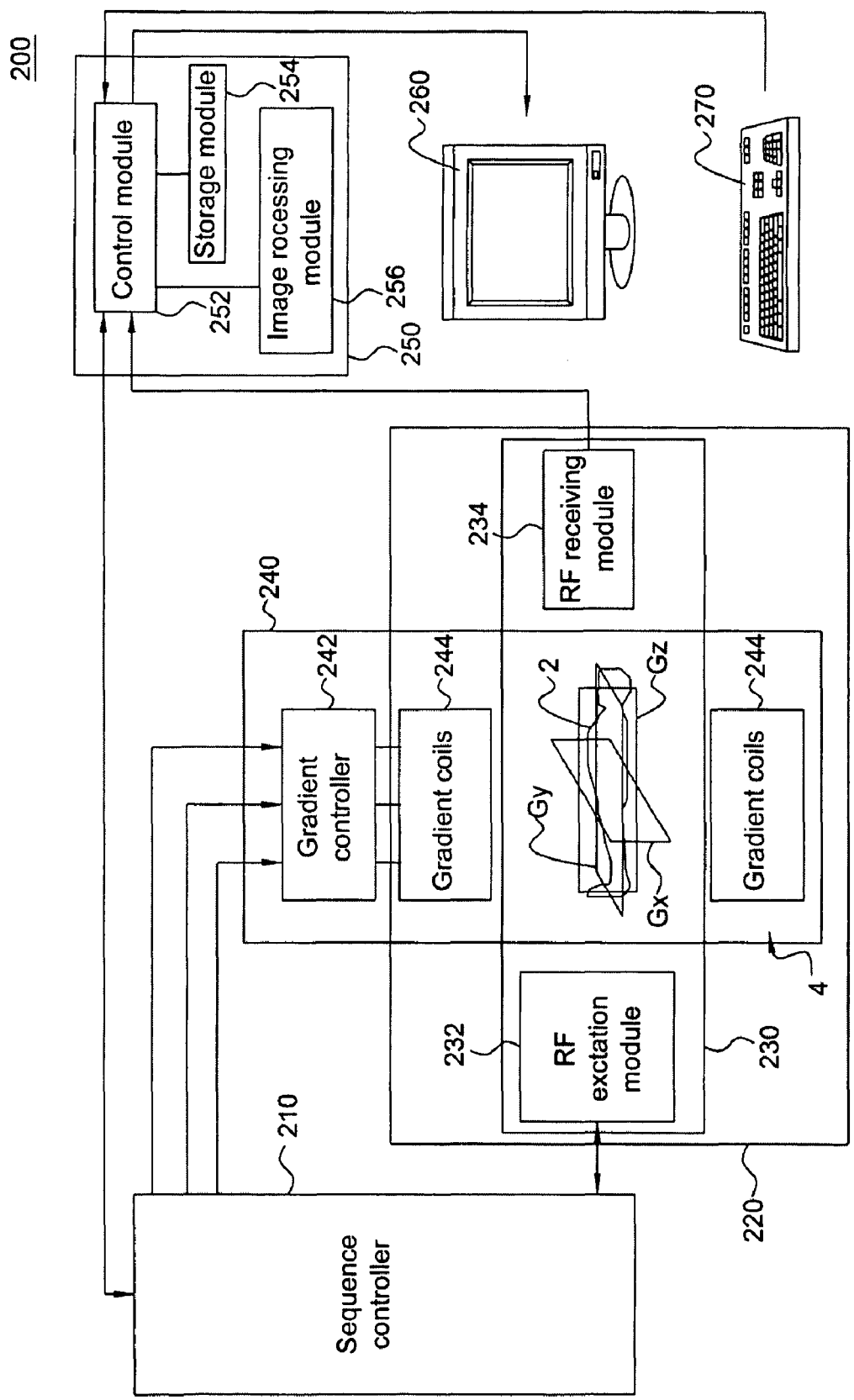
FIG. 2 is a diagram illustrating the configuration of an exemplary wideband MRI apparatus in accordance with one embodiment.

FIG. 2 is a diagram illustrating the configuration of an exemplary wideband MRI apparatus 200 in accordance with one embodiment, capable of simultaneously acquiring MR images for different kinds of nuclei. As shown, the wideband MRI apparatus 200 comprises a sequence controller 210, a static magnetic field output module 220, an RF system 230 that has an RF excitation module 232 and an RF receiving module 234, and a gradient output module 240 that has a gradient controller 242 and a plurality of gradient coils 244 controlled by the gradient controller 242. Additionally, the wideband MRI apparatus 200 can also comprise a main console 250 that has a control module 252, a storage module 254, and an imaging processing module 256. Moreover, the wideband MRI apparatus 200 can further comprise a display device 260 and an input device 270.

The control module 252, a computer for example, can be configured to control the sequence controller 210, the storage module 254, the imaging processing module 256, the display device 260, and the input device 270 to carry out MRI operation, by executing and accessing several programs and data stored in the storage module 270, e.g., a memory. During an MRI operation, the sequence controller 210, functioning responsively to the control module 252, can control the RF system 230 and the gradient output module 240 to sequentially perform an excitation procedure and a reception procedure. After the excitation and reception procedures, the imaging processing module 256 and the display device 260 can then perform an image reconstruction procedure in response to the control module 252, reconstructing data acquired in the reception procedure to display reconstructed images. Additionally, a user can interactively operate the wideband MRI apparatus 200 and set several physical quantities via communication with the control module 200 by using the display device 260, e.g., a graphic display, and the input device 270, e.g., a keyboard. The imaging operation of the wideband MRI apparatus 200 during the excitation, reception, and image-reconstruction procedures is detailed below.

1. Excitation Procedure

The static magnetic field output module 220 can be configured to generate a static and uniform magnetic field $B_0$ in a measuring space 4 in which resides a subject 2, e.g., a living body or part of a living body, to be scanned. The direction of the static magnetic field, for example, is along a z-axis.

The RF excitation module 232 in the RF system 230, responsive to the sequence controller 210, can generate a wideband RF signal that has a plurality of frequency bands respectively corresponding to a plurality of different kinds of nuclei, and transmit the RF signal to the measurement space 4 for simultaneously exciting the different kinds of nuclei within the subject 2. The frequency difference between different frequency bands, for example, can be as large as several MHzs or several tens of MHzs, depending on the kinds of nuclei to be excited.

Figure 3:
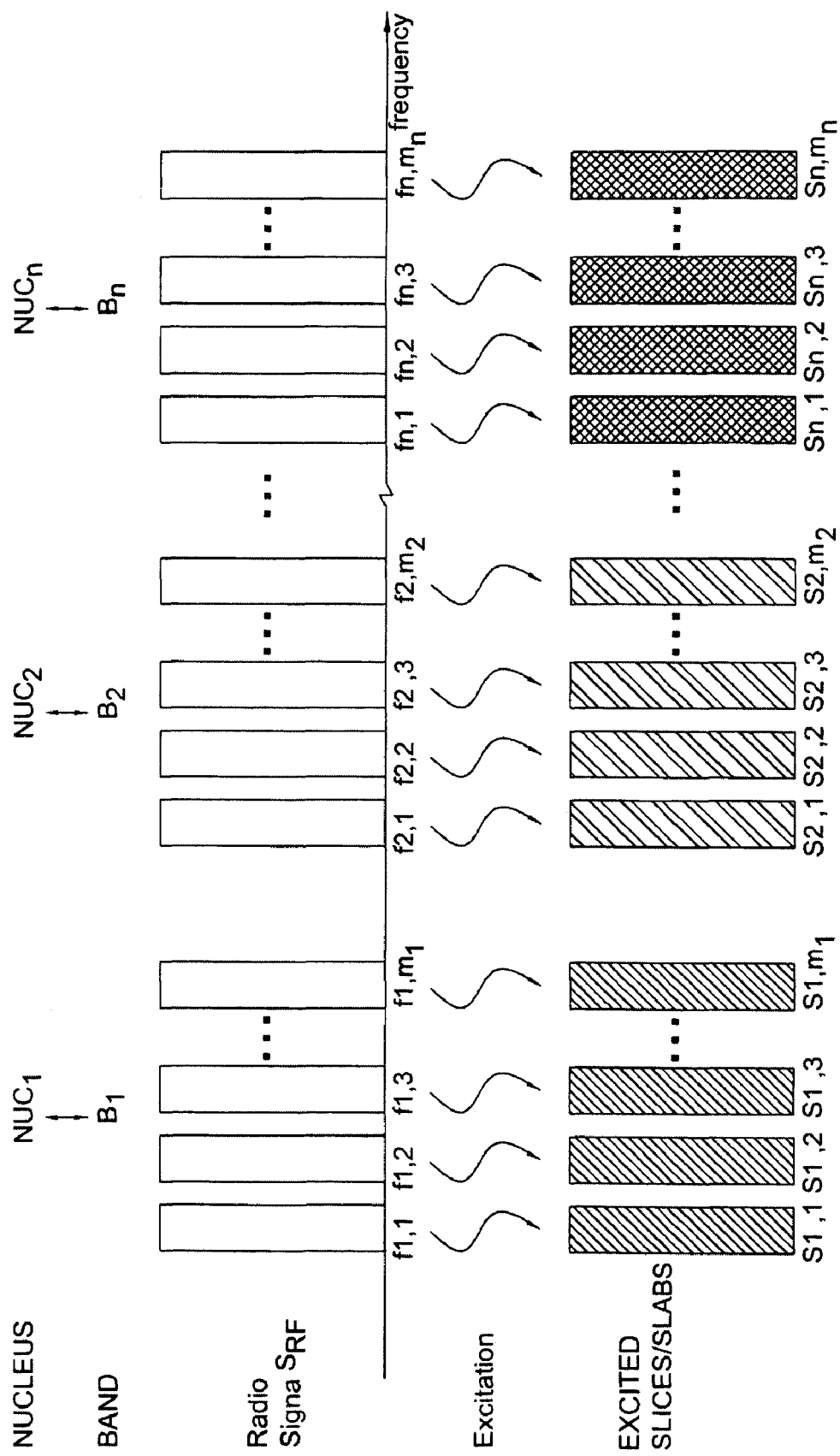
FIG. 3 is an exemplary diagram illustrating the frequency distribution of an RF signal in accordance with one embodiment.

FIG. 3 is an exemplary diagram illustrating the frequency distribution of the RF signal that can be generated by the RF excitation module 220 in FIG. 2 in accordance with one embodiment. As shown, the RF signal has a plurality of frequency bands $B_1, B_2, \ldots,$ and $B_n$ (n is an integer and $2 \leq n$) that correspond to a plurality of different kinds of nuclei $NUC_1, NUC_2, \ldots,$ and $NUC_n$, respectively. Moreover, each of the frequency bands, $B_i$ (i is an integer and i=1~n), can include one or more frequency components $f_{i,1}$-$f_{i,m_i}$ ($m_i$ is an integer and $m_i \geq 1$ for each i) that are equal, or close to the resonance frequencies of a corresponding kind of nuclei $NUC_i$ at excitation positions. Accordingly, one or more frequency components $f_{i,1}$-$f_{i,m_i}$ within each frequency band $B_i$ can be used to excite one or more slices/slabs $S_{i,1}$-$S_{i,m_i}$, respectively.

Referring back to FIG. 2, the RF excitation module 230, for example, can include a single RF transmission coil element (not shown) capable of irradiating the wideband RF signal that has the different frequency bands respectively corresponding to the different kinds of nuclei. Alternatively, the RF excitation module 230 can otherwise include a plurality of RF transmission coil elements (not shown), each simultaneously irradiating a respective RF signal that has one or more frequency bands for exciting the corresponding kind(s) of nuclei. Because the frequency differences between different frequency bands can be large, coupling reduction mechanism between the coil elements may not be required in some embodiments. However, coupling reduction mechanism may also be implemented to prevent interference between different frequency bands in some other mechanism if required.

When the RF signal generated by the RF excitation module 230 is applied, the gradient controller 242, responsive to the sequence controller 210, can control the gradient coils 242 to generate and transmit a slice/slab selection gradient $G_{ss}$ slice for 2D and slab for 3D, to the measurement space 4. The slice/slab selection gradient $G_{ss}$ can be a magnetic field gradient serving to select the excitation location(s) for the slice(s)/slab(s) for each kind of nucleus. Described in more detail, the slice/slab selection gradient $G_{ss}$ can be used to add spatial variation to the uniform magnetic field $B_0$ generated by the static magnetic field output module 220, such that the same kind of nuclei at different positions can have different resonance frequencies at different positions, and one or more frequency components within each frequency band of the RF signal can therefore simultaneously excite one kind of nucleus corresponding to the frequency band at selected excitation location(s) corresponding to the frequency component(s).

Figure 4:
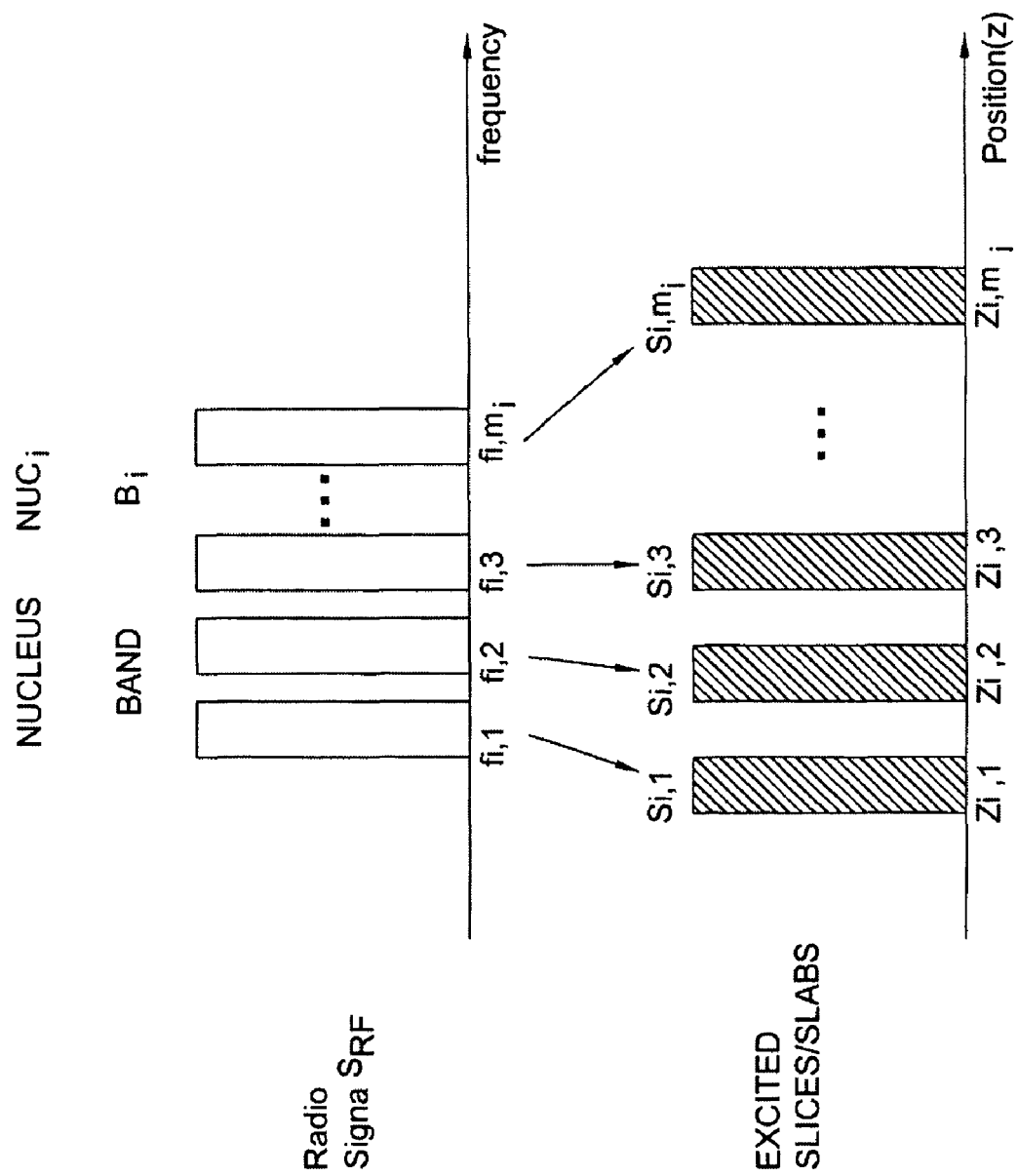
FIG. 4 is a schematic diagram illustrating the correspondence between the frequency component(s) in a frequency band and the excitation location(s) of the slice(s)/slab(s)

FIG. 4 is a schematic diagram illustrating the correspondence between the frequency component(s) in a frequency band and the excitation location(s) of the slice(s)/slab(s). As shown in FIG. 3, the frequency components $f_{i,1}, f_{i,2}, \ldots,$ and $f_{i,m_i}$ in a frequency band $B_i$ (i is an integer and i=1~n) can be used to excite one or more slices/slabs $S_{i,1}, S_{i,2}, \ldots,$ and $S_{i,m_i}$, respectively, which have respective positions of $z_{i,1}, z_{i,2}, \ldots,$ and $z_{i,m_i}$. It is noted that a single frequency band $B_i$ can be used to excite a single slice/slab or multiple slice/slabs, depending on the frequency band $B_i$ has a single or multiple frequencies.

Figure 5A:
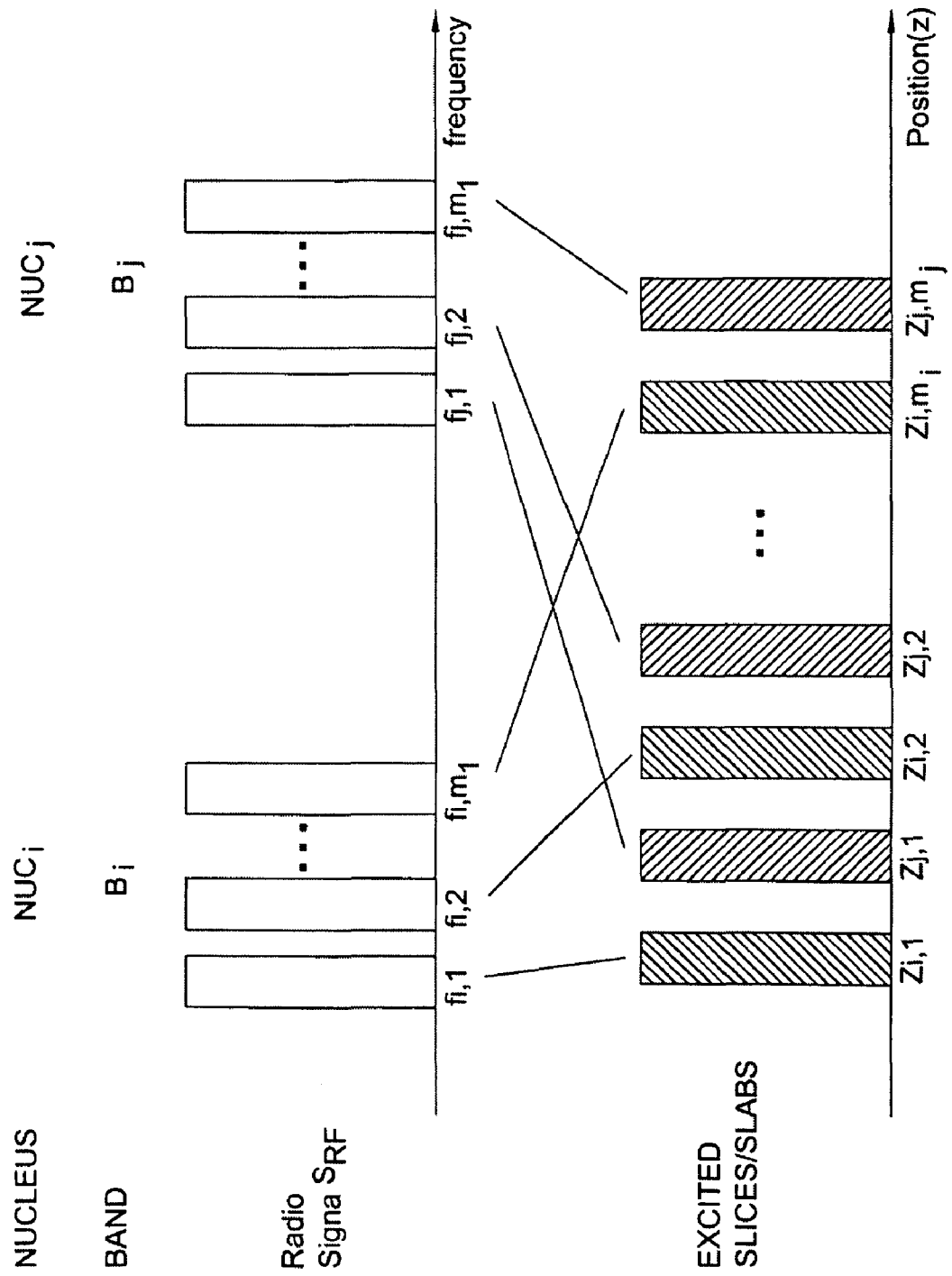
FIGS. 5A and 5B are diagrams schematically illustrating the excitation locations distribution of the slices/slabs for different kinds of nuclei according to two different embodiments.
Figure 5B:
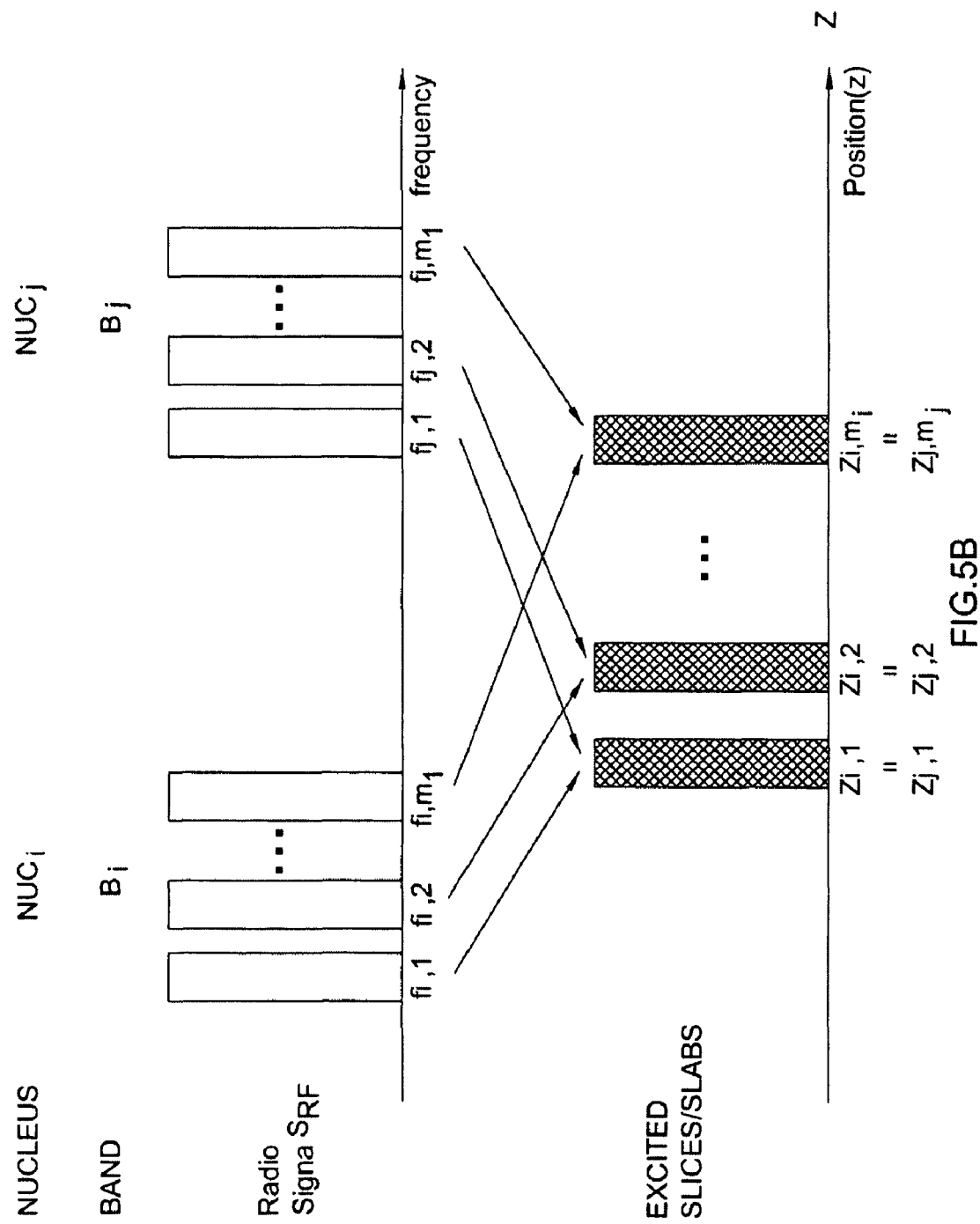

Additionally, it is also noted that the slices/slabs for different kinds of nuclei can be at the same or different excitation locations, as is shown with FIGS. 5A and 5B, respectively, which are diagrams schematically illustrating the excitation locations distribution of the slices/slabs for different kinds of nuclei in accordance with two different embodiments. In FIG. 5A, two different frequency bands $B_i$ and $B_j$ (j is an integer and i≠j) excite their respective slice(s)/slab(s) at different locations, as is referred hereafter to as "multiple slices/slabs for multiple nuclei". On the contrary, in FIG. 5B, two different frequency bands $B_i$ and $B_j$ (j is an integer and i≠j) excite their respective slice(s)/slab(s) at the same location(s), as is referred hereafter to as "single slice/slab for multiple nuclei".

The slice/slab selection gradient $G_{ss}$, in accordance with one specific embodiment, can be a time-invariant, i.e., static, gradient magnetic field varied linearly along a slice/slab selection direction, which, preferably, can be parallel with the static magnetic field direction, i.e., the z-axis in the embodiment. The slice/slab selection gradient $G_{ss}$ can therefore be expressed as $G_{ss}z$, where $G_{ss}$ denotes the intensity, e.g., in Gauss/centimeter, of the slice/slab selection gradient $G_{ss}$, and z denotes the position along the z-axis. However, various other slice/slab selection gradients can also be used in alternative embodiments.

Figure 6:
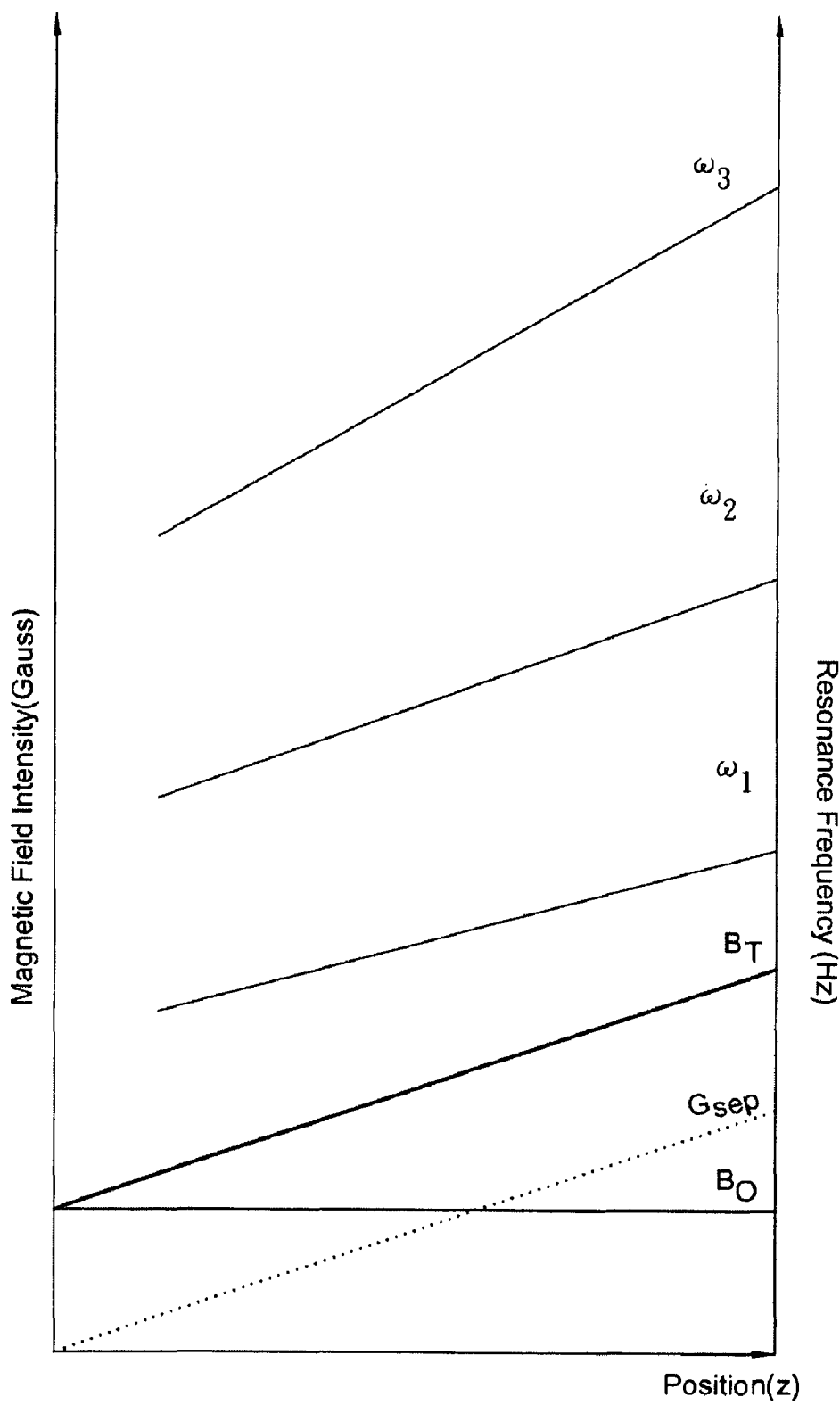
FIG. 6 is an exemplary diagram showing magnetic fields and the resonance frequencies for different kinds of nuclei as a function of the position in accordance with one embodiment.

FIG. 6 is an exemplary diagram showing the dependence among the static magnetic field $B_0$, the slice/slab selection gradient $G_{ss}$, and the total magnetic field $B_T$, as a function of the position in the measuring space 230, in accordance with one specific embodiment with a time-invariant linear slice/slab selection gradient $G_{ss}$. FIG. 6 further shows the resonance frequencies for different kinds of nuclei under the total magnetic field $B_T$ as a function of the position, for explaining the principle behind the slice/slab selection gradient $G_{ss}$.

Referring to FIG. 6, the total magnetic field $B_T$ in the measuring space 4, being the static magnetic field $B_0$ plus the variation due to the slice/slab selection gradient $G_{ss}$, is a time-invariant gradient magnetic field linearly varied along the slice/slab selection direction, expressed as $B_T=B_0+G_{ss}z$. Under such a total magnetic field $B_T$, the resonance frequency of a nucleus, or the required frequency to excite the nuclei, therefore depends both on the kind and the position of the nucleus, as can be mathematically expressed:

$$\omega_i(z)=(B_0+G_{ss}z)\times\gamma_i, \quad (Eq.\ 1)$$

where $\omega_i(z)$ denotes the resonance frequency of a nucleus $NUC_i$ at position z, and $\gamma_i$ denotes the atomic gyromagnetic ratio of the nucleus $NUC_i$.

Figure 7A:
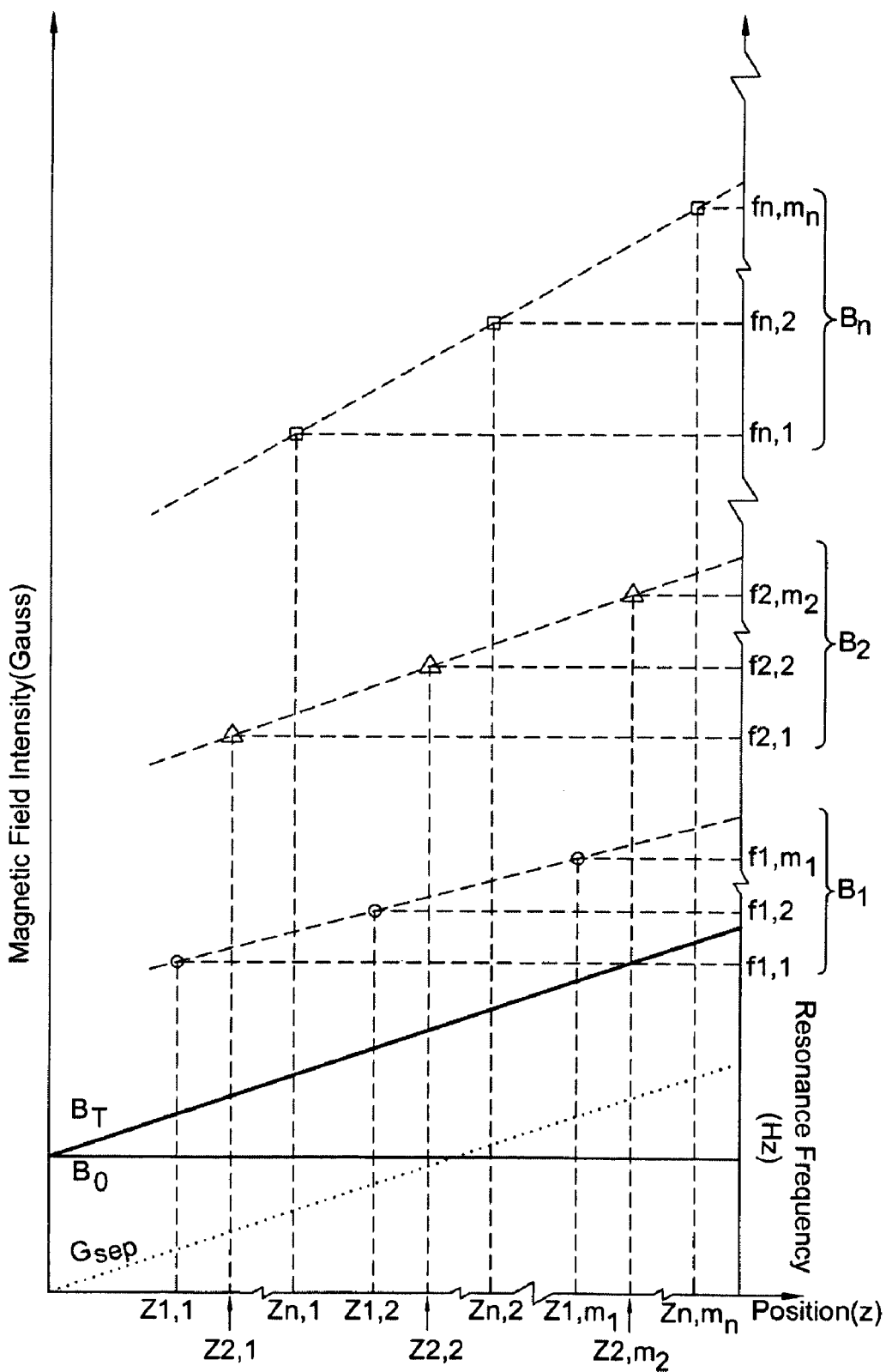
FIGS. 7A and 7B are exemplary diagrams showing the relationship between the frequency component distribution and slice/slab location distribution in accordance with two different embodiments.
Figure 7B:
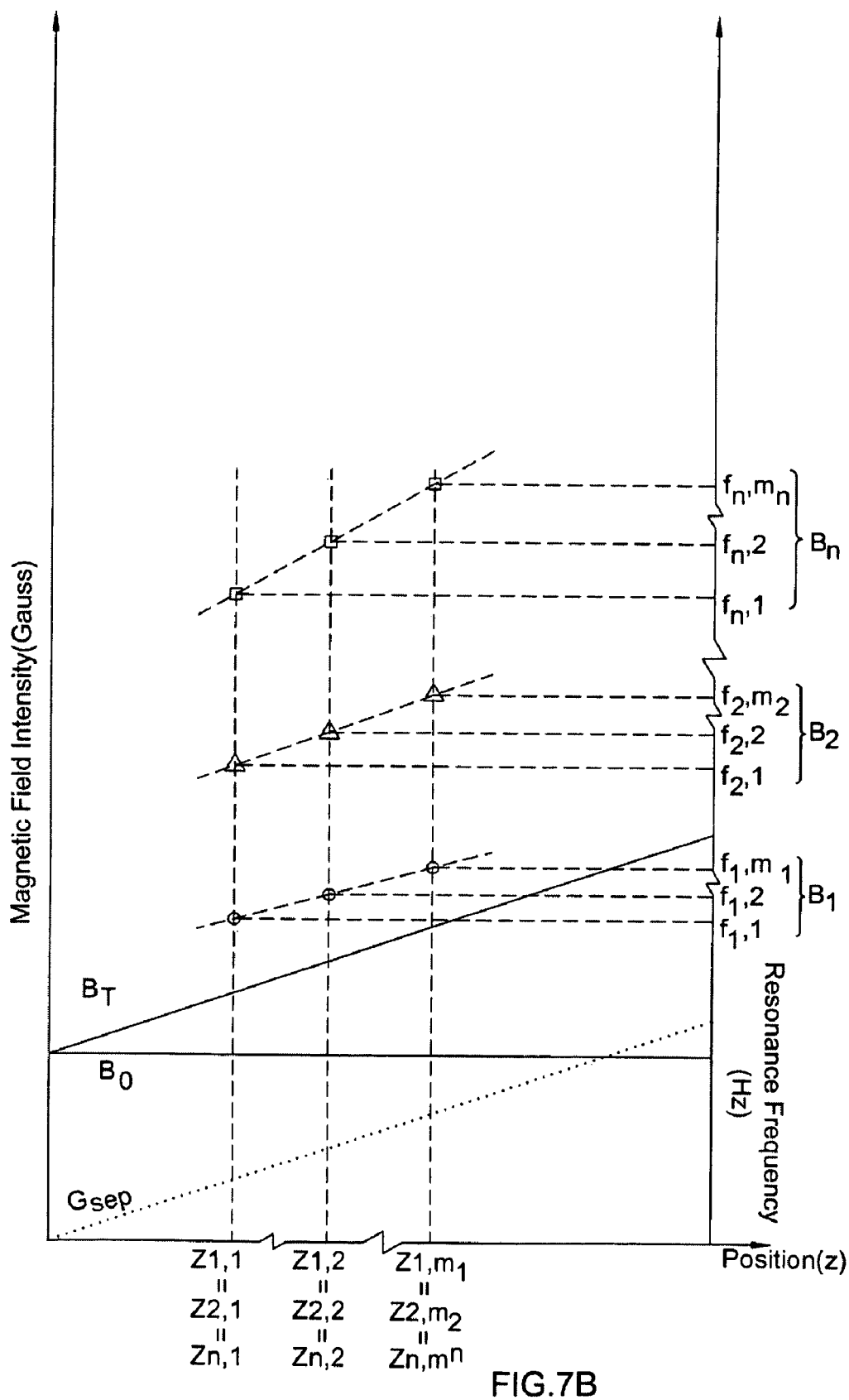

FIGS. 7A and 7B are exemplary diagrams showing the relationship between the frequency component distribution within each frequency band of the RF signal and its corresponding slice/slab location distribution in the measuring space 4, in accordance with two different embodiments. FIGS. 7A and 7B, respectively corresponding to FIGS. 5A and 5B, show two cases where different kinds of nuclei NUC1-NUCn are excited at the same and different excitation locations.

Referring both to FIGS. 7A and 7B, due to the nuclei kind factor, i.e., $\gamma_i$, in $\omega_i(z)$, different kinds of nuclei $NUC_1$-$NUC_n$ are required to be excited with different frequency bands B1-Bn corresponding to the atomic gyromagnetic ratios $\gamma_1$-$\gamma_n$ of the different kinds of nuclei $NUC_1$-$NUC_n$.

Moreover, due to the position factor, i.e., z, in $\omega_i(z)$, for each kind of nucleus $NUC_i$ (i is an integer and i=1~n), one or more slice(s)/slab(s) Si,1-Si,$m_i$ ($m_i$ is an integer and $m_i \geq 1$ for each i) are required to be excited with one or more frequency component(s) fi,1-fi,$m_i$ corresponding to the position(s) zi,1-zi,$m_i$ of the slice(s)/slab(s) Si,1-Si,$m_i$.

More specifically, the frequency difference between any two neighboring frequency components fi,k and fi,(k+1) (k is an integer and k=1~$m_i$) within the frequency band $B_i$ can be determined according both to the absolute distance |zi,k-zi,(k+1)| between two neighboring slices/slabs Si,k and Si,(k+1) and the atomic gyromagnetic ratio of the nucleus $NUC_i$ according to an equation:

$$f_{sep,i}=d_{sep,i}\times\gamma_i\times G_{ss}, \quad (Eq.\ 2)$$

where $f_{sep,i}$ denotes the frequency difference, i.e., $f_{sep,i}$=|fi,k-fi,(k+1)|, e.g., in Hz; $d_{sep,i}$ denotes the absolute distance between two neighboring slices/slabs for nucleus $NUC_i$, i.e., $d_{sep,i}$=|zi,k-zi,(k+1)|, e.g., in centimeter, that, for example, is set by the user according to practical needs; $\gamma_i$ denotes the atomic gyromagnetic ratio of nucleus $NUC_i$; and $G_{ss}$ denotes the intensity of the slice/slab selection gradient $G_{ss}$, e.g., in Gauss/centimeter.

Accordingly, the respective frequency components fi,1-fi,$m_i$ in each frequency band $B_i$ can be determined according to Eq. 2 to acquire desired slice/slab location distribution. In addition, the respective frequency components fi,1-fi,$m_i$ and fj,1-fj,$m_j$ (j is an integer and i≠j) in frequency bands Bi and Bj can have a configuration of multiple slices/slabs for multiple nuclei, meaning that the corresponding slice/slab locations zi,1-zi,$m_i$ are different from zj,1-zj,$m_j$, as shown in FIG. 7A, or alternatively, can otherwise have a configuration of single slice/slab for multiple nuclei, meaning that the corresponding slice/slab locations zi,1-zi,$m_i$ are equal to zj,1-zj,$m_j$, as shown in FIG. 7B.

Benefiting by the RF excitation module capable of generating a wideband RF signal, the wideband MRI apparatus 200 can simultaneously excite different kinds of nuclei within the subject at the same or different locations without any switching mechanism between different frequency bands, thus accelerating the excitation procedure.

2. Reception Procedure

The RF receiving module 234 in the RF system, responsive to the sequence controller 210, can be configured to detect a responsive RF signal, the so-called "free induction decay (FID) signal," generated by the different excited nuclei. The FID signal, similar to the RF signal generated by the RF excitation module 230, can also be a wideband signal having a plurality of frequency bands that are respectively emitted by the different kinds of nuclei when relaxing from excitation states to lower energy states.

Specifically, the RF receiving module 234 can simultaneously receive and process, e.g., amplify, demodulate, filter, and digitize, the different frequency bands within the RF signal, and then provide digital data to the control module, which further transmits the digital data to the imaging processing module, or alternatively, directly provide the digital data to the imaging processing module. The digital data can also be stored in the storage module 254 if required. The digital data represent the MR images in frequency space, or Fourier space or k space.

The RF receiving module 234, for example, can include a single RF reception coil element (not shown) capable of simultaneously detecting different frequency bands within the wideband FID signal generated by different kinds of nuclei. Alternatively, the RF receiving module can include a plurality of RF reception coil elements, each simultaneously detecting one or more frequency bands emitted by corresponding kind(s) of nuclei. Because the frequency differences between different frequency bands can be large, coupling reduction mechanism between the coil elements may not be required in some embodiments; however, coupling reduction mechanism may also be implemented to prevent interference between different frequency bands in some other mechanism if required.

It should be noted that the RF excitation module 232 and the RF receiving module 234 are not required to be disposed separately. In other embodiments, the RF excitation module 232 and the RF receiving module 234 can be integrated as a single RF excitation/receiving module (not shown). Specifically, the single RF excitation/receiving module, for example, can include a single RF transmission/reception coil element capable of transmitting and receiving a wideband RF signal. Alternatively, the single RF excitation/receiving module can include a plurality of RF transmission/reception coil elements, each simultaneously transmitting and receiving one or more frequency bands corresponding to one or more kinds of nuclei.

The gradient controller 242, responsive to the sequence controller 252, can control the gradient coils 242 to generate and transmit a spatial encoding gradient $G_{enc}$ and a slice/slab separation gradient $G_{sep}$, slice for 2D and slab for 3D, to the measurement space 4. The spatial encoding gradient $G_{enc}$ and the slice/slab separation gradient $G_{sep}$ are used to add spatial information in different directions to the FID signal generated by the RF receiving module.

The spatial encoding gradient is a magnetic field gradient serving to encode the responsive RF received by the RF receiving module 234. Specifically, the spatial encoding gradient $G_{enc}$ comprises a phase-encoding gradient $G_p$ applied to phase-encode the responsive RF signal and a frequency-encoding gradient $G_f$ applied to frequency-encode the responsive RF signal.

On the other hand, the slice/slab separation gradient $G_{sep}$ is a magnetic field gradient serving to separate any two neighboring frequency components in each frequency band in the FID signal received by the RF receiving module, or effectively, to separate any two neighboring slices/slices for each kind of nucleus. The slice/slab separation gradient $G_{sep}$, for example, can be a time-invariant gradient magnetic field linearly varied along a slice/slab separation direction, which, for example, can be parallel with the normal direction of the slices/slabs, i.e. the z-axis in the embodiment.

In accordance with one 2D embodiment, the phase-encoding gradient $G_p$ may be implemented as a magnetic field gradient along a phase-encoding direction, e.g., a y-axis, here denoted as $G_p=G_y$. The frequency-encoding gradient $G_f$ may be implemented as a magnetic field gradient along a frequency-encoding direction, e.g., an x-axis, here denoted as $G_f=G_x$. There can be a variety of generation sequences of the gradients. For example, when the RF receiving module receives the FID signal, the gradient output module can simultaneously generate the phase-encoding gradient, i.e., $G_y$, the frequency-encoding gradient, i.e., $G_x$, and the slice separation gradient $G_{sep}$. The spatial encoding gradient when generated simultaneously with the slice/slab separation gradient $G_{sep}$ is hereafter denoted as $G_{spen}$, i.e., $G_{spen}=G_x+G_y$ in the example. For another example, the gradient output module can first generate the phase-encoding gradient, i.e., $G_y$. And then, the RF receiving module is activated to receive the FID signal, while the gradient output module simultaneously generates the frequency-encoding gradient, i.e., $G_{spen}=G_f=G_x$, and the slice separation gradient $G_{sep}$. A similar procedure can be repeated several times, referred to as the number of the spatial encoding, with different intensities of the phase-encoding gradient $G_p=G_y$.

In accordance with one 3D embodiment, the phase-encoding gradient may be implemented as two magnetic fields along two phase-encoding directions, e.g., along a y-axis and the z-axis, here denoted as $G_p=G_y+G_z$. The frequency-encoding gradient may be implemented as a magnetic field along a frequency-encoding direction, e.g., along an x-axis, here denoted as $G_f=G_x$. There can be a variety of generation sequences of the gradients. For example, the gradient output module can first generate the phase-encoding gradient, i.e., $G_y+G_z$. And then, the RF receiving module is activated to receive the FID signal, while the gradient output module simultaneously generates the frequency-encoding gradient, i.e., $G_{spen}=G_f=G_x$, and the slice separation gradient $G_{sep}$ along the z-axis. A similar procedure can be repeated several times, referred to as the number of the spatial encoding, with different intensities of the phase-encoding gradient $G_p$, that is, different intensity combinations of $G_y$ and $G_z$.

FIG. 8 is an exemplary diagram schematically illustrating the separation of neighboring frequency components in a frequency band of the FID signal received by the RF receiving module 234 under different intensities of the slice/slab separation gradient $G_{sep}$ in accordance with one embodiment. As shown, different frequency components in a frequency band $B_i$ (i=1~n) of the received FID signal, if without the slice/slab separation gradient $G_{sep}$, would be overlapped completely at a center frequency $f_{ci}$ of the frequency band $B_i$. With the increase of the intensity of the slice/slab separation gradient $G_{sep}$, neighboring slices/slices can be more separated from each other.

Regarding determination of the intensities of time-invariant and linear slice/slab separation gradient $G_{sep}$ and the spatial encoding gradient $G_{spen}$ in accordance with one specific embodiment, their intensity dependency can be satisfied by an equation:

$$G_{sep}/G_{spen} \geq FOV_{spen}/d_{sep,i}, \quad \text{(Eq. 3)}$$

where $G_{sep}$ denotes the intensity of the slice/slab separation gradient $G_{sep}$, e.g., in Gauss/centimeter; $G_{spen}$ denotes the intensity of the spatial encoding gradient $G_{spen}$, e.g., in Gauss/centimeter, which may be the intensity of $G_x+G_y$, $G_x$, or $G_y$, depending on the generation sequences of the gradients; $FOV_{spen}$ denotes a field of view, e.g., width and in centimeters, along the direction of the spatial encoding gradient $G_{spen}$ that, for example, is set by according to practical needs; and $d_{sep,i}$ denotes the absolute distance between two neighboring slices/slabs for nucleus $NUC_i$, e.g., in centimeter that, for example, is set according to practical needs.

One unique feature of the invention is that, benefiting by the RF receiving module capable of receiving a wideband FID signal, the wideband MRI apparatus 200 can simultaneously detect relaxation energy released by different kinds of nuclei without any switching mechanism between different frequency bands, thus accelerating the reception procedure.

3. Image Reconstruction Procedure

After the imaging processing module 256 receives the digital data, it then performs transformation, e.g., 2D/3D Fourier Transform on the digital data in frequency space to reconstruct real-time MR images in real space. The digital data in the frequency space are also wideband data, including data for a plurality of frequency bands corresponding to the different kinds of nuclei. Consequently, MR images for the different kinds of nuclei can also be simultaneously acquired. The display device 260 can then display the reconstructed real-time MR images.

Figure 9:
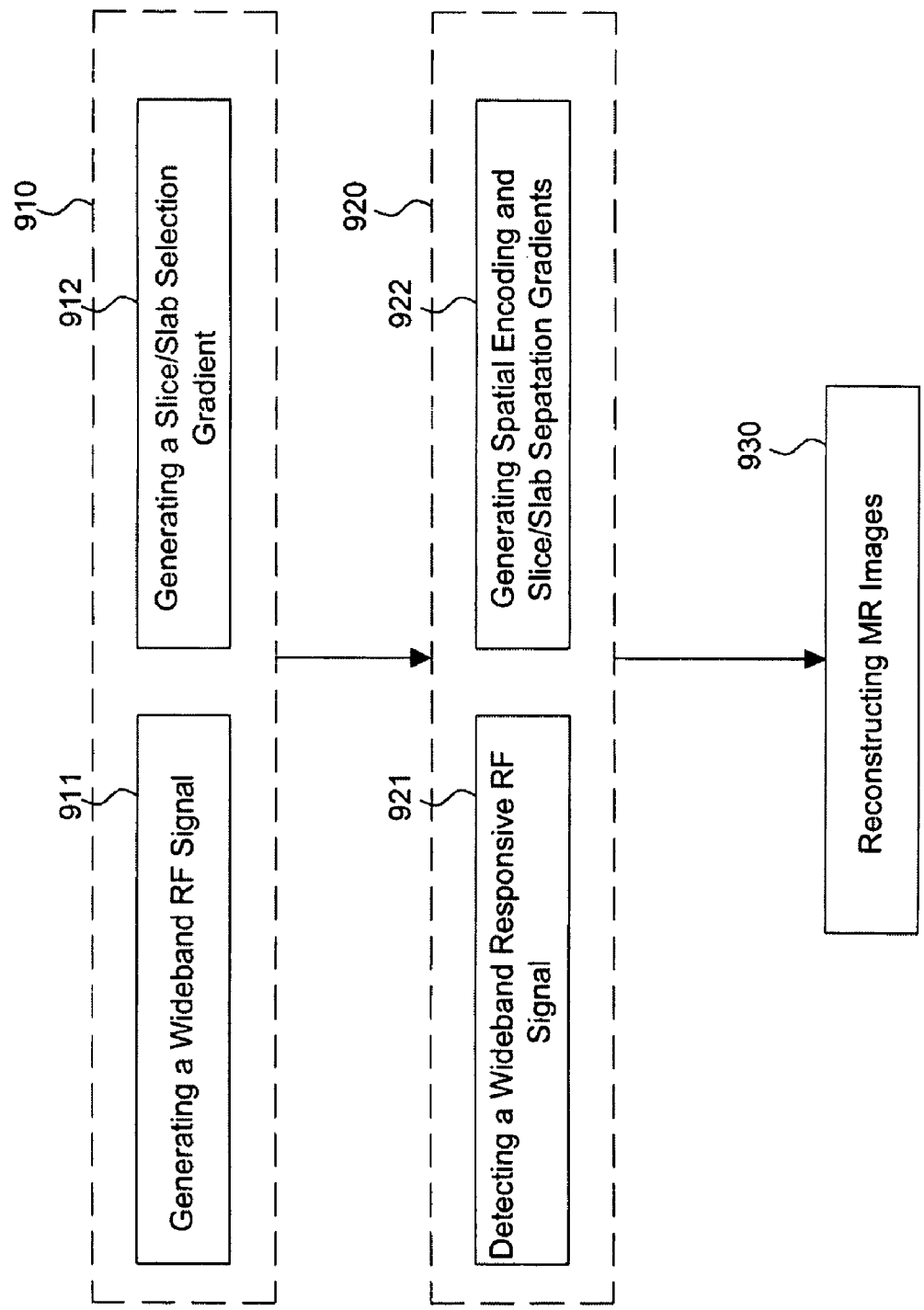
FIG. 9 is a flow chart of an MRI method in accordance with one embodiment.

FIG. 9 is a flow chart of an MRI method in accordance with one embodiment. In step 910, which is an excitation step, a wideband RF signal is generated (in sub-step 911), having a plurality of frequency bands respectively corresponding to a plurality of different kinds of nuclei. Additionally, a slice/slab selection gradient $G_{ss}$, slice for 2D and slab for 3D, to the measurement space is simultaneously generated (in sub-step 912).

In step 920, which is a reception step, a wideband responsive RF signal generated by the different kinds of nuclei is detected (in sub-step 921), having a plurality of frequency bands that are respectively emitted by the different kinds of nuclei when relaxing from excitation states to lower energy states. Additionally, a spatial encoding gradient $G_{enc}$ and a slice/slab separation gradient $G_{sep}$, slice for 2D and slab for 3D, are also generated to add spatial information to the responsive RF signal (in sub-step 921). In preferable embodiments, the spatial encoding gradient $G_{enc}$ comprises a gradient $G_{spen}$ generated simultaneously with the slice/slab separation gradient $G_{sep}$ when the wideband responsive RF signal is detected.

In step 930, which is an image reconstruction step, MR images for the different kinds of nuclei are reconstructed according to the detected responsive RF signal acquired in step 921.

It should be noted that, with the provision of the slice/slab separation gradient $G_{sep}$ in the reception procedure, two neighboring frequency components in each frequency band in the FID signal can be separated to a desired degree. However, the slice/slab separation gradient $G_{sep}$ may disadvantageously cause unwanted blur in reconstructed MR images, thus deteriorating the image quality of the reconstructed MR images. The image blur may be along the encoding direction of the spatial encoding gradient $G_{spen}$. Appropriate determination for some related physical quantities in the wideband MRI apparatus 200 is thus required such that the image blur can meet practical needs.

Figure 10:
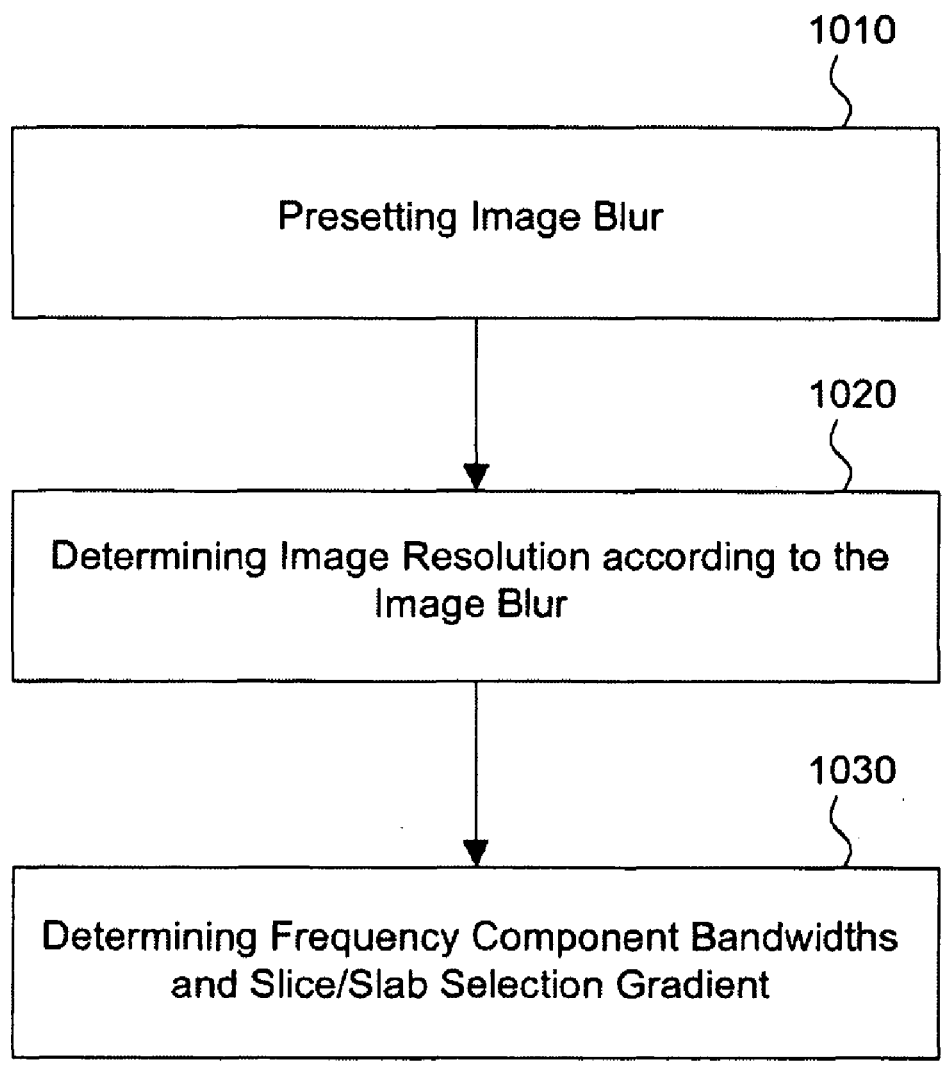
FIG. 10 is a flowchart of MR image quality optimization in accordance with one embodiment.

FIG. 10 is a flowchart of MR image quality optimization in accordance with one embodiment, illustrating steps of determination of several physical quantities in the wideband MRI apparatus 200 in FIG. 2 or the MRI method in FIG. 9.

In step 1010, the image blur for each kind of nucleus $NUC_i$ (i in an integer and i=1~n) is preset, e.g., in a desired range. The image blur can be an adjustable parameter determined by a user according to practical needs for acceptable degree of image quality. In accordance with one embodiment, very good, good, and poor image quality can be acquired respectively when blur(pixel)<1, 1≦blur(pixel)<3, and 3≦blur (pixel). In some other embodiments, this step may be performed according to other various needs that have different requirements for image blur.

In step 1020, the image resolution along the normal direction, e.g., along the z-axis, of the respective excited slice(s)/slab(s) for each kind of nucleus $NUC_i$ is determined according to the corresponding image blur preset in step 1010. In one embodiment with a time-invariant linear slice/slab separation gradient $G_{sep}$, the respective image blur for the nucleus $NUC_i$ can be expressed as:

$$blur_i(\text{in } mm) = res_{normal,i} \times G_{sep}/G_{spen},  \quad (\text{Eq. 4.1})$$

$$blur_i(\text{in pixel}) = blur_i(\text{in } mm)/res_{spen,i}. \quad (\text{Eq. 4.2})$$

In these equations, $blur_i$ denotes the degree of the image blur for nucleus $NUC_i$. Additionally, $res_{normal,i}$ denotes the image resolution along the normal direction (e.g. along the z-axis) of the excited slice(s)/slab(s) for nucleus $NUC_i$. Specifically, in 2D cases, the image resolution $res_{normal,i}$ along the normal direction, e.g., along the z-axis, of the excited slice(s) is the thickness of one slice along the normal direction, e.g., along the z-axis, of the slice(s). In 3D cases, the image resolution $res_{normal,i}$ along the normal direction, e.g. along the z-axis, of the excited slab(s) is the ratio of the thickness of one slab along the normal direction, e.g. along the z-axis, along the slab to the number of the spatial encoding along the normal direction along the slab. Additionally, $G_{sep}$ denotes the intensity of the slice/slab selection gradient $G_{ss}$, which may be along the z direction and in Gauss/centimeters. Additionally, $G_{spen}$ denotes the intensity of the spatial encoding gradient $G_{spen}$, e.g., in Gauss/centimeter, which may be the intensity of $G_x+G_y$, $G_x$, or $G_y$, depending on the generation sequences of the gradients. Additionally, $res_{spen,i}$ denotes the resolution along the direction of the spatial encoding gradient $G_{spen}$ for nucleus $NUC_i$.

Combining Eqs. 3, 4.1 and 4.2, the image resolution $res_{normal,i}$ for nucleus $NUC_i$ can therefore be determined according to the preset image blur $blur_i$(in pixel) as the following equation:

$$res_{normal,i} = [blur_i(\text{in pixel}) \times d_{sep,i} \times res_{spen,i}]/FOV_{spen}, \quad (\text{Eq. 5})$$

where the image blur $blur_i$(in pixel) has been determined in step 1010. Additionally, the absolute distance $d_{sep,i}$ between two neighboring slices/slabs for nucleus $NUC_i$, and the resolution $res_{spen,i}$ and the field of view $FOV_{spen}$ along the direction of the spatial encoding gradient $G_{spen}$, for example, can all be adjustable parameters set according to practical needs.

In step 1030, bandwidths of the respective frequency components within frequency band $B_i$ and the intensity of the slice/slab selection gradient $G_{ss}$ are determined according to the image resolution $res_{normal,i}$ determined in step 1020.

Figure 11:
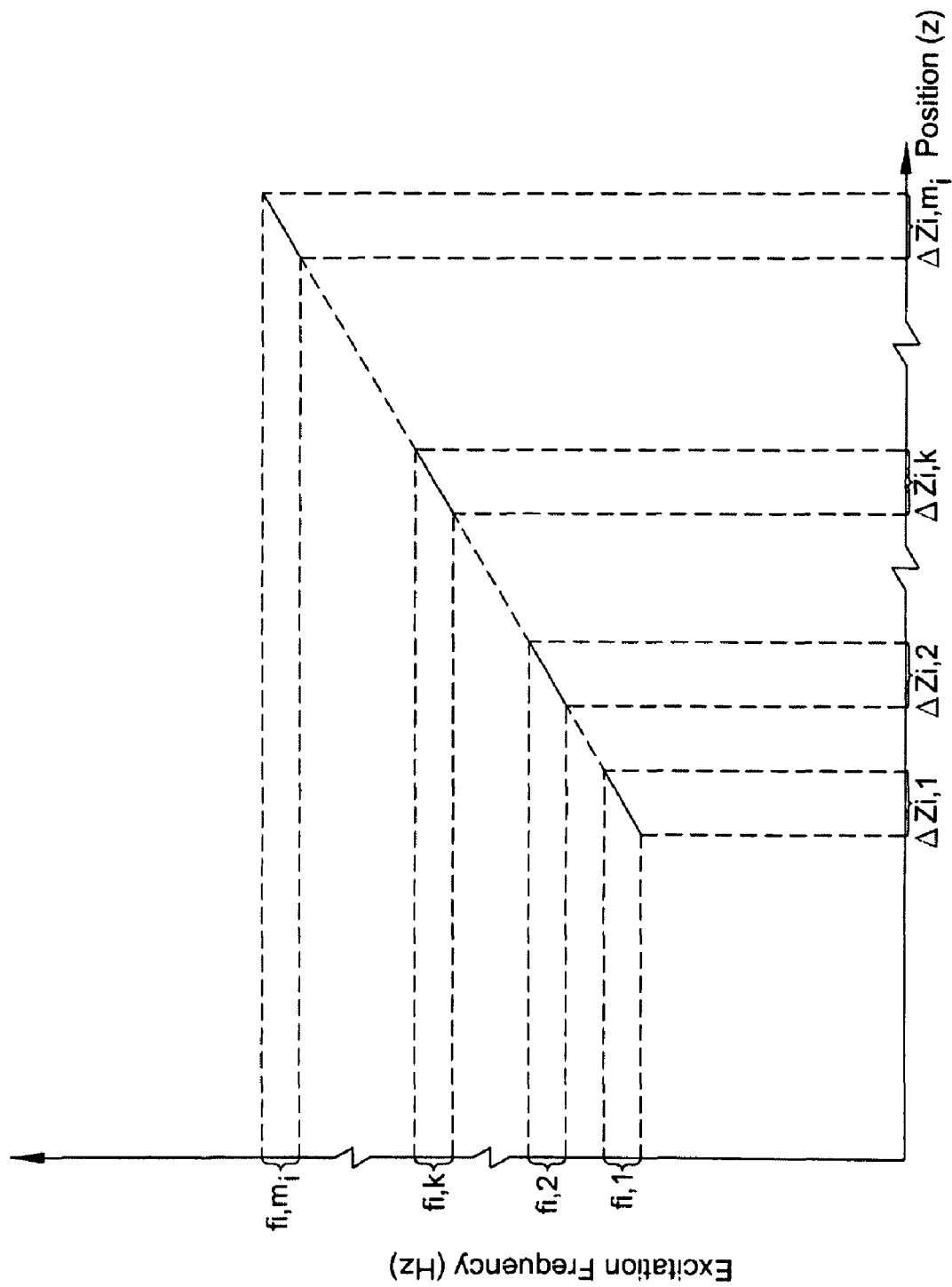
FIG. 11 is an exemplary diagram illustrating the relationship between the bandwidths of frequency components and the thicknesses of corresponding slices/slabs in accordance with one embodiment.

FIG. 11 is an exemplary diagram illustrating the relationship between the bandwidths of frequency components in a single frequency band of the RF signal and the thicknesses of corresponding slices/slabs for the embodiment shown in FIG. 7A or 7B. As shown, each frequency component fi,k (i and j are integers and i=1~n, and k=1~$m_i$) has a respective narrow bandwidth Δfi,k, which excites a slice/slab Si,k having a thickness Δzi,k that can be expressed as:

$$\Delta zi,k = \Delta f_{i,k}/(G_{ss} \times \gamma_i) \quad (\text{Eq. 6}).$$

Accordingly, the respective bandwidth Δfi,k of each frequency component fi,k within the band $B_i$ of the RF signal and the intensity $G_{ss}$ of the slice/slab selection gradient $G_{ss}$ can be determined according to Eq. 6, where the thickness Δzi,k has been determined along with the image resolution $res_{normal,i}$ in step 1020.

According to Eqs. 5 and 6, the image blur is proportional to the product of slice/slab thickness, frequency component bandwidth, and the intensity $G_{ss}$ of the slice/slab selection gradient $G_{ss}$. Accordingly, the image blur of the reconstructed images for the nucleus $NUC_i$ can be effectively reduced by decreasing the bandwidths of frequency components within the corresponding frequency band $B_i$ and/or by increasing the intensity $G_{ss}$ of the slice/slab selection gradient $G_{ss}$.

In summary, the abovementioned embodiments pioneer to simultaneously excite/acquire slices/slabs for different kinds of nuclei at the same or different locations, thus saving considerable total imaging operation time. Specifically, for conventional technologies, excessive time is required to spend on sequentially exciting and acquiring the slices/slabs S1,1, S1,2, . . . , S1, $m_1$, S2,1, S2,2, . . . , S2, $m_2$, . . . Sn,1, Sn,2, . . . , and Sn,$m_n$, so totally, N=($m_1$+$m_2$+ . . . +$m_n$) times of imaging operations are performed. In the abovementioned embodiments, however, only a one-time imaging operation is required to simultaneously excite and acquire all these N slices/slabs, so the total number is merely 1/N that of the conventional technology. Consequently, numerous advantages and benefits can be brought about. For example, for clinical applications, diagnosis time can be significantly shortened, thus enhancing the efficiency of medical service and reducing the suffering or tension of patients. This considerable time saving is also always highly appreciated in other applications.

Additionally, the ability to simultaneously acquire MR images for different embodiments also solves the problem occurring in conventional technologies that MR images for different nuclei cannot be captured one time and real physiological activities within a subject cannot be faithfully demonstrated due to sequential MR imaging operations. The acquired MR images for different kinds of nuclei reveal different kinds of information about the scanned object, for example, different physiological activity information, different disease information, in different parts of a living body. Accordingly, the embodiments can achieve more accurate, complete and profound observation on a scanned subject. For clinical applications, for example, the precision of the diagnosis and the effectiveness of disease tracking can therefore be tremendously increased.

Moreover, the effect of the slice/slab separation gradient on image blur is provided in the abovementioned embodiments, enabling image quality optimization to be realized by appropriately setting related physical quantities, which can include reducing image blur by decreasing the bandwidths of frequency components within the frequency band and/or by increasing the intensity of the slice/slab selection gradient.

Furthermore, the embodiments can be employed to accomplish whole-subject, e.g., whole-body, scanning. Such whole-body scanning demonstrates the advantage of the invention-saving considerable MR imaging time, particularly for large area imaging and/or different kinds of nuclei scanning.

In some, embodiments realizing whole-subject, e.g., whole-body, scanning, the coil element(s) in the RF excitation module 232 and the RF receiving module 234 can be implemented to cover the whole subject, e.g., the whole body, such that slices/slabs for different kinds of nuclei within the whole body can be simultaneously excited and detected. Accordingly, MR images for different kinds of nuclei within the whole body are allowed to be simultaneously acquired. In such embodiments, technologies achieving higher homogeneity for a static magnetic field in large area, i.e., the coverage area for the whole body, are preferably employed, for the benefit of improving MR image qualities.

In some other examples, a sliding bed/table can be alternatively implemented in a measurement space to carry a subject and slide with time during an imaging operation. The coil element(s) in RF excitation module 232 and RF receiving module 234 can there be implemented to cover merely a part of the subject, e.g., a living body, such that slices/slabs for different kinds of nuclei within the part can be simultaneously excited and detected. Due to the sliding bed/table sliding with time, different parts of the subject lying on the sliding bed/table can be excited and detected sequentially. By collecting the data acquired from different parts of the body, MR images for different kinds of nuclei within the whole body can still be acquired. Compared with the whole-body coverage embodiments, because the excited and detected area, i.e., the coverage area for part of the body, in such embodiments can be smaller, the embodiments can be realized without requiring high homogeneity of the static magnetic field in a large area.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A magnetic resonance imaging (MRI) method, comprising
    generating a wideband RF signal that has a plurality of frequency bands respectively corresponding to a plurality of slices/slabs for a plurality of different kinds of nuclei at different locations in a subject, to simultaneously excite the slices/slabs for the different kinds of nuclei;
    detecting a wideband responsive RF signal that has a plurality of frequency bands respectively emitted by the slices/slabs for the different kinds of nuclei; and
    reconstructing magnetic resonance images of the slices/slabs for the different kinds of nuclei based on the wideband responsive RF signal.

2. The MRI method of claim 1, further comprising:
    generating a slice/slab selection gradient when the wideband RF signal is generated to select excitation locations of the slices/slabs for each kind of nucleus;
    generating a spatial encoding gradient to encode the wideband responsive RF signal; and
    generating a slice/slab separation gradient to separate the slices/slabs for the different kinds of nuclei.

3. The MRI method of claim 2, further comprising:
    presetting image blur for the reconstructed magnetic resonance images; and
    determining image resolution for each kind of nucleus at least according to the preset image blur.

4. The MRI method of claim 3, wherein further comprising determining bandwidths of the respective frequency components within each frequency band or the intensity of the slice/slab selection gradient according to the determined image resolution for each kind of nucleus.

5. The MRI method of claim 3, wherein determination of the image resolution along a first direction for each kind of nucleus is realized according to the respective image blur preset for the kind of nucleus, the respective absolute distance between two neighboring slices/slabs for the kind of nucleus, the respective image resolution along a second direction for the kind of nucleus, and a field of view along the direction of the spatial encoding gradient.

6. The MRI method of claim 3, wherein determination of the respective image resolution for each kind of nucleus is realized according to an equation:

$$res_{normal,i} = \lfloor blur_i \times d_{sep,i} \times res_{spen,i} \rfloor / FOV_{spen},$$

where $res_{normal,i}$ denotes the respective image resolution along a first direction for an ith kind of nucleus, $blur_i$ is the image blur preset for the ith kind of nucleus, $d_{sep,i}$ denotes the absolute distance between the two neighboring slices/slabs for the ith kind of nucleus, $res_{spen,i}$ denotes the respective image resolution in a second direction for the ith kind of nucleus, and $FOV_{spen}$ denotes the field of view along the direction of the spatial encoding gradient.

7. The MRI method of claim 2, further comprising increasing the intensity of the slice/slab selection gradient to decrease image blur for each kind of nucleus.

8. The MRI method of claim 2, further comprising decreasing bandwidths of the respective frequency components within one of the frequency bands to decrease image blur for the kind of nucleus corresponding to the frequency band.

9. The MRI method of claim 2, wherein the spatial encoding gradient comprises a phase-encoding gradient and a frequency-encoding gradient.

10. The MRI method of claim 1, wherein
    each of the frequency bands comprises at least one frequency component for exciting at least one slice/slab, respectively, and
    the slices/slabs excited by different frequency bands are at different locations.

11. The MRI method of claim 2, wherein
    each of the frequency bands comprises at least one frequency component for exciting at least one slice/slab, respectively, and
    the method further comprises determining the frequency components within each frequency band according to an equation:

$$f_{sep,i} = d_{sep,i} \times \gamma_i \times G_{ss},$$

where $f_{sep,i}$ denotes the frequency difference between two neighboring frequency components within an ith frequency band of the frequency bands, $d_{sep,i}$ denotes the absolute distance between two neighboring slices/slabs for an ith kind nucleus corresponding to the ith frequency band, $\gamma_i$ denotes the atomic gyromagnetic ratio of the ith kind nucleus, and $G_{ss}$ denotes the intensity of the slice/slab selection gradient.

12. The MRI method of claim 2, further comprising determining the slice/slab separation gradient according to the spatial encoding gradient, a field of view along the direction of the spatial encoding gradient, and the absolute distance between the two neighboring slices/slabs for each kind of nucleus.

13. The MRI method of claim 12, wherein generation of the slices/slabs separation gradient is realized such that an equation for each kind of nucleus is satisfied:

$$G_{sep}/G_{spen} \geq FOV_{spen}/d_{sep,i},$$

where $G_{sep}$ denotes the intensity of the slice/slab separation gradient, $G_{spen}$ denotes the intensity of the spatial encoding gradient, $FOV_{spen}$ denotes a field of view along the direction of the spatial encoding gradient, and $d_{spen,i}$ denotes the absolute distance between two neighboring slices/slabs for an ith nucleus of the different kinds of nuclei.

14. The MRI method of claim 1, wherein the RF signal and the RF responsive signal each covers the whole part of a subject to simultaneously excite and detect the whole part of the subject, respectively.

15. The MRI method of claim 14, further comprising:
applying a static magnetic field simultaneously with generation of the RF signal and detection of the responsive signal; and
increasing homogeneity for the static magnetic field to increase image qualities of the magnetic resonance images.

16. The MRI method of claim 1, wherein the RF signal and the RF responsive signal each covers a part of a subject that is slid with time, to sequentially excite and detect different parts of the subject, respectively.

17. A magnetic resonance imaging (MRI) apparatus, comprising
an RF system configured to:
(i) generate a wideband RF signal that has a plurality of frequency bands respectively corresponding to a plurality of slices/slabs for a plurality of different kinds of nuclei at different locations in a subject, to simultaneously excite the slices/slabs for the different kinds of nuclei and
(ii) detect a wideband responsive RF signal that has a plurality of frequency bands respectively emitted by the slices/slabs for the different kinds of nuclei; and
an imaging processing module configured to reconstruct magnetic resonance images of the slices/slabs for the different kinds of nuclei based on the wideband responsive RF signal.

18. The MRI apparatus of claim 17, wherein the RF system comprises one or more RF coil elements, each simultaneously irradiating a respective RF signal that has one or more frequency bands for exciting one or more corresponding kinds of the nuclei.

19. The MRI apparatus of claim 17, wherein the RF system comprises one or more RF coil elements, each simultaneously detecting a respective RF signal that has one or more frequency bands emitted by corresponding kind(s) of the nuclei.

20. The MRI apparatus of claim 17, further comprising:
a gradient output module configured to
(i) generate a slice/slab selection gradient when the RF system generates the wideband RF signal to select excitation locations of the slices/slabs for each kind of nucleus;

(ii) generate a spatial encoding gradient to encode the wideband responsive RF signal; and
(iii) generate a slice/slab separation gradient to separate the slices/slabs for the different kinds of nuclei.

21. The MRI apparatus of claim 20, wherein
the MRI apparatus further presets image blur of the reconstructed magnetic resonance images and determines the image resolution for each kind of nucleus in a first direction at least according to the preset degree of the image blur.

22. The MRI apparatus of claim 21, wherein the MRI apparatus further determines the bandwidths of the respective frequency components within each frequency band or the intensity of the slice/slab selection gradient according to the image resolution for the kind of nucleus.

23. The MRI apparatus of claim 22, wherein the MRI apparatus further determines the image resolution along a first direction for each kind of nucleus according to the respective image blur preset for the kind of nucleus, the respective absolute distance between two neighboring slices/slabs for the kind of nucleus, the respective image resolution along a second direction for the kind of nucleus, and a field of view along the direction of the spatial encoding gradient.

24. The MRI apparatus of claim 22, wherein the MRI apparatus further determines the respective image resolution for each kind of nucleus according to an equation:

$$res_{normal,i} = \lfloor blur_i \times d_{sep,i} \times res_{spen,i} \rfloor / FOV_{spen},$$

where $res_{normal,i}$ denotes the respective image resolution along a first direction for an ith kind of nucleus, $blur_i$ is the image blur preset for the ith kind of nucleus, $d_{sep,i}$ denotes the absolute distance between the two neighboring slices/slabs for the ith kind of nucleus, $res_{spen,i}$ denotes the respective image resolution in a second direction for the ith kind of nucleus, and $FOV_{spen}$ denotes the field of view along the direction of the spatial encoding gradient.

25. The MRI apparatus of claim 20, wherein the gradient output module is controlled to increase the intensity of the slice/slab selection gradient to decrease image blur for each kind of nucleus.

26. The MRI apparatus of claim 20, wherein the RF system is controlled to decrease bandwidths of the respective frequency components within one of the frequency bands to decrease image blur for the kind of nucleus corresponding to the frequency band.

27. The MRI method of claim 20, wherein the spatial encoding gradient comprises a phase-encoding gradient and a frequency-encoding gradient.

28. The MRI apparatus of claim 17, wherein
each of the frequency bands comprises at least one frequency component for exciting at least one slice/slab, respectively, and
the slices/slabs excited by different frequency bands are at different locations.

29. The MRI apparatus of claim 20, wherein
each of the frequency bands comprises at least one frequency component for exciting at least one slice/slab, respectively, and
the MRI apparatus further determines the frequency components within each frequency band according to an equation:

$$f_{sep,i} = d_{sep,i} \times \gamma_i \times G_{ss},$$

where $f_{sep,i}$ denotes the frequency difference between two neighboring frequency components within an ith frequency band of the frequency bands, $d_{sep,i}$ denotes the absolute distance between two neighboring slices/slabs for an ith kind nucleus corresponding to the ith frequency band, $\gamma_i$ denotes the atomic gyromagnetic ratio of the ith kind nucleus, and $G_{ss}$ denotes the intensity of the slice/slab selection gradient.

30. The MRI apparatus of claim 20, wherein the MRI apparatus further determines the slice/slab separation gradient according to the spatial encoding gradient, a field of view along the direction of the spatial encoding gradient, and the absolute distance between two neighboring slices/slabs for each kind of nucleus.

31. The MRI apparatus of claim 30, wherein the MRI apparatus further determines the slices/slabs separation gradient such that an equation for each kind of nucleus is satisfied:

$$G_{sep}/G_{spen} \geq FOV_{spen}/d_{sep,i},$$

where $G_{sep}$ denotes the intensity of the slice/slab separation gradient, $G_{spen}$ denotes the intensity of the spatial encoding gradient, $FOV_{spen}$ denotes a field of view along the direction of the spatial encoding gradient, and $d_{sep,i}$ denotes the absolute distance between two neighboring slices/slabs for an ith nucleus of the different kinds of nuclei.

32. The MRI apparatus of claim 17, wherein the RF system covers the whole part of a subject to simultaneously excite and detect the whole part of the subject.

33. The MRI apparatus of claim 17, wherein the RF system covers a part of a subject that is slid with time, to sequentially excite and detect different parts of the subject.

34. The MRI method of claim 1, further comprising using a sliding table to carry the subject and slide with time such that different parts of the subject lying on the sliding table are excited and detected sequentially.

35. The MRI apparatus of claim 17, wherein the RF system further comprises a sliding table to carry the subject and slide with time such that different parts of the subject lying on the sliding table are excited and detected sequentially.

* * * * *